(12) United States Patent
Biber et al.

(10) Patent No.: US 7,834,628 B2
(45) Date of Patent: Nov. 16, 2010

(54) ARRANGEMENT TO TRANSMIT MAGNETIC RESONANCE SIGNALS VIA MULTIPLEXED MULTIPLEXER RECEPTION BRANCHES

(75) Inventors: Stephan Biber, Erlangen/Frauenaurach (DE); Jan Bollenbeck, Eggolsheim (DE); Ralph Oppelt, Uttenreuth (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 106 days.

(21) Appl. No.: 12/243,038

(22) Filed: Oct. 1, 2008

(65) Prior Publication Data

US 2009/0096455 A1    Apr. 16, 2009

(30) Foreign Application Priority Data

Oct. 1, 2007   (DE) ................ 10 2007 047 021

(51) Int. Cl.
 *G01V 3/00*   (2006.01)
(52) U.S. Cl. ...................................... 324/318
(58) Field of Classification Search ......... 324/300–322
 See application file for complete search history.

(56) References Cited

U.S. PATENT DOCUMENTS

| | | | |
|---|---|---|---|
| 4,885,541 A | 12/1989 | Hayes | |
| 4,947,121 A | 8/1990 | Hayes | |
| 5,160,891 A | 11/1992 | Keren | |
| 5,296,813 A | 3/1994 | Holmes et al. | |
| 5,572,130 A | 11/1996 | Ratzel | |
| 5,729,129 A * | 3/1998 | Acker | 324/207.12 |
| 6,150,816 A * | 11/2000 | Srinivasan | 324/318 |
| 6,161,032 A * | 12/2000 | Acker | 600/424 |
| 6,477,398 B1 * | 11/2002 | Mills | 600/409 |
| 6,850,064 B1 * | 2/2005 | Srinivasan | 324/318 |
| 7,375,524 B2 * | 5/2008 | Katscher et al. | 324/309 |
| 7,382,129 B2 * | 6/2008 | Mills | 324/318 |
| 7,514,927 B2 * | 4/2009 | Herzka et al. | 324/318 |
| 7,586,306 B2 * | 9/2009 | Szyperski et al. | 324/309 |
| 7,627,365 B2 * | 12/2009 | Chance | 600/475 |

FOREIGN PATENT DOCUMENTS

WO   WO 2007/043009   4/2007

* cited by examiner

*Primary Examiner*—Brij B Shrivastav
*Assistant Examiner*—Dixomara Vargas
(74) *Attorney, Agent, or Firm*—Schiff Hardin LLP

(57) ABSTRACT

An arrangement to transmit magnetic resonance signals has at least two reception branches. Each reception branch contains a single antenna of a local coil as well as an amplifier connected with the single antenna, such that an amplified magnetic resonance signal is formed from a magnetic resonance signal that is acquired via the single antenna. In a multiplexer, each input is connected with a respective reception branch, such that the amplified magnetic resonance signals of the reception branch are combined by the multiplexer into a resulting signal using a time multiplexing method. A transmission path is connected on one side with an output of the multiplexer and on the other side with a receiver, such that the resulting signal is transmitted from the multiplexer to the receiver via the transmission path.

15 Claims, 11 Drawing Sheets

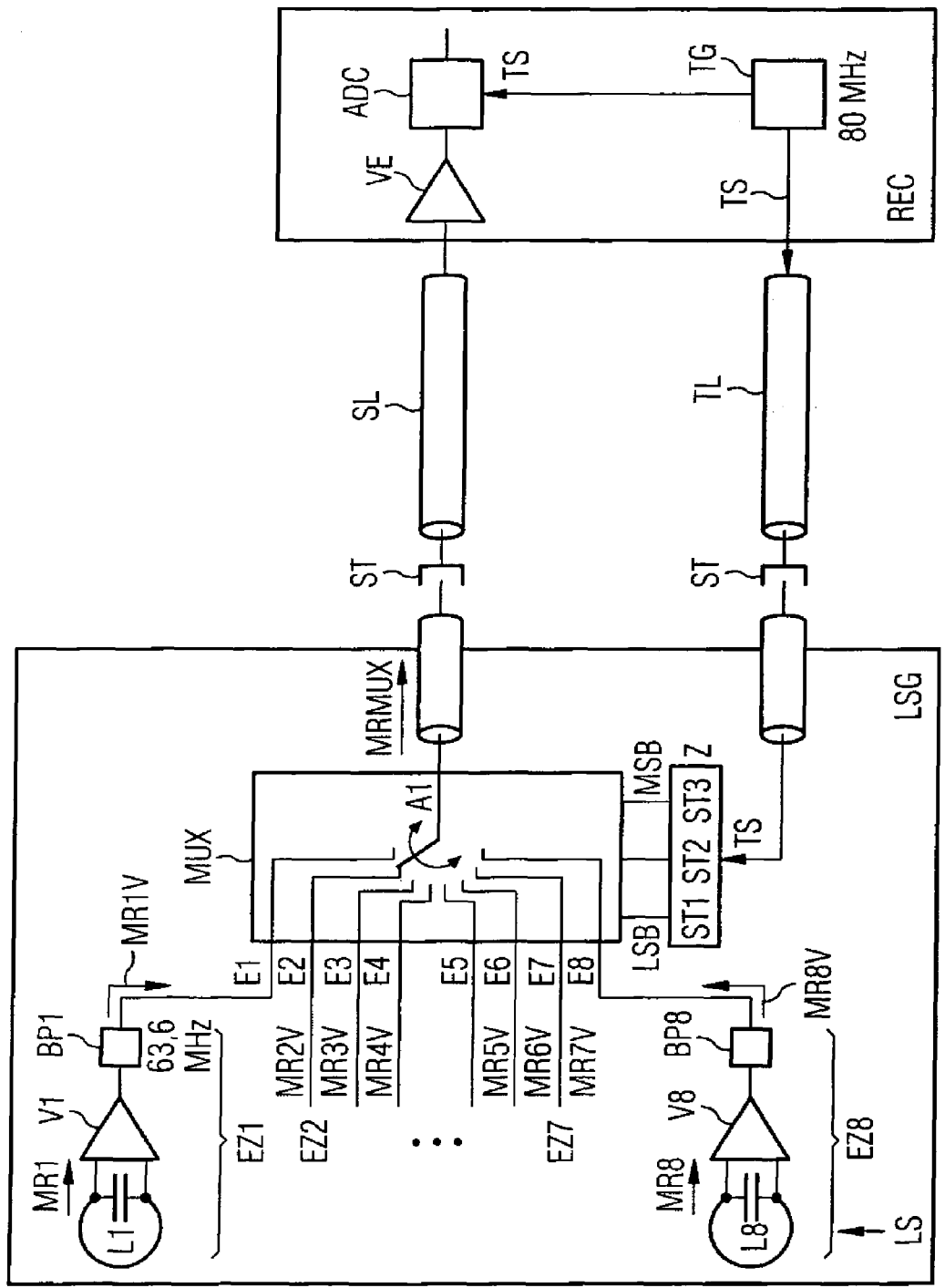

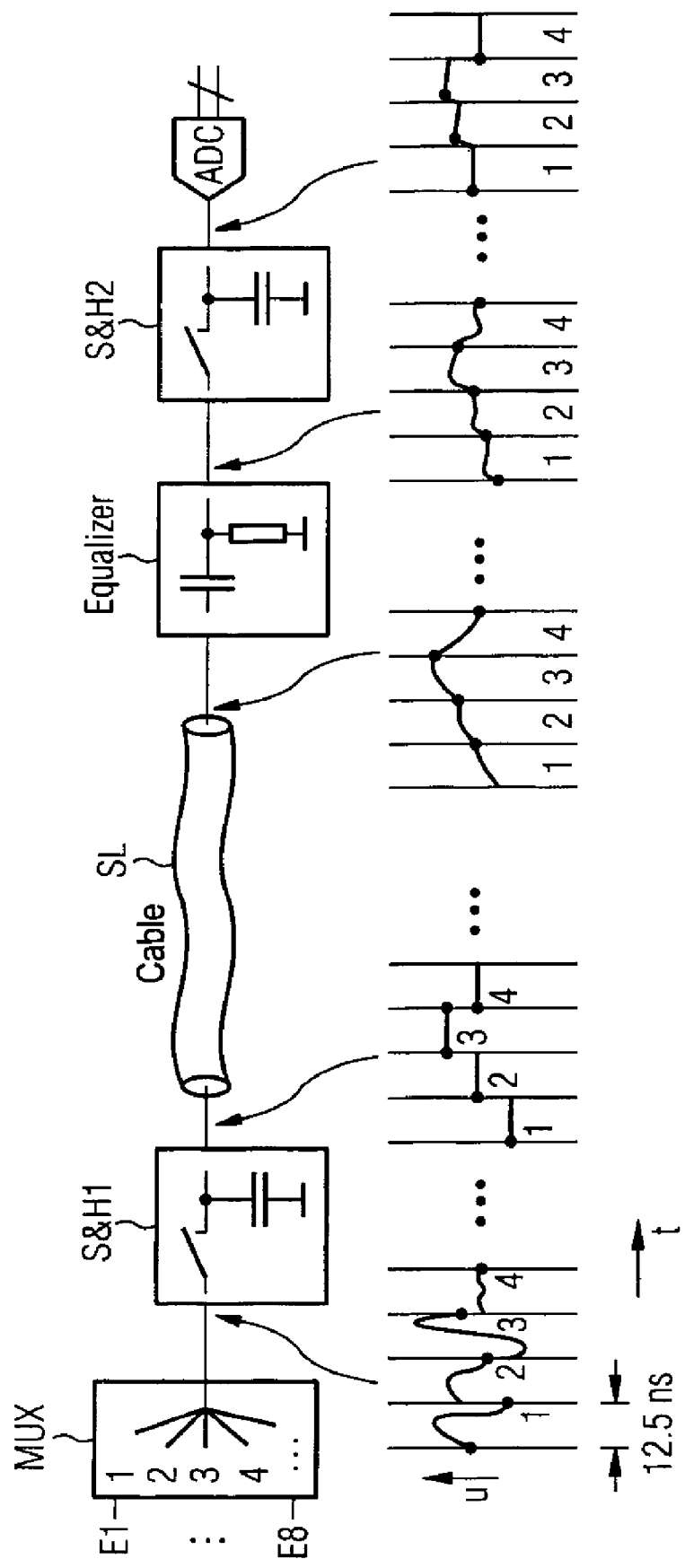

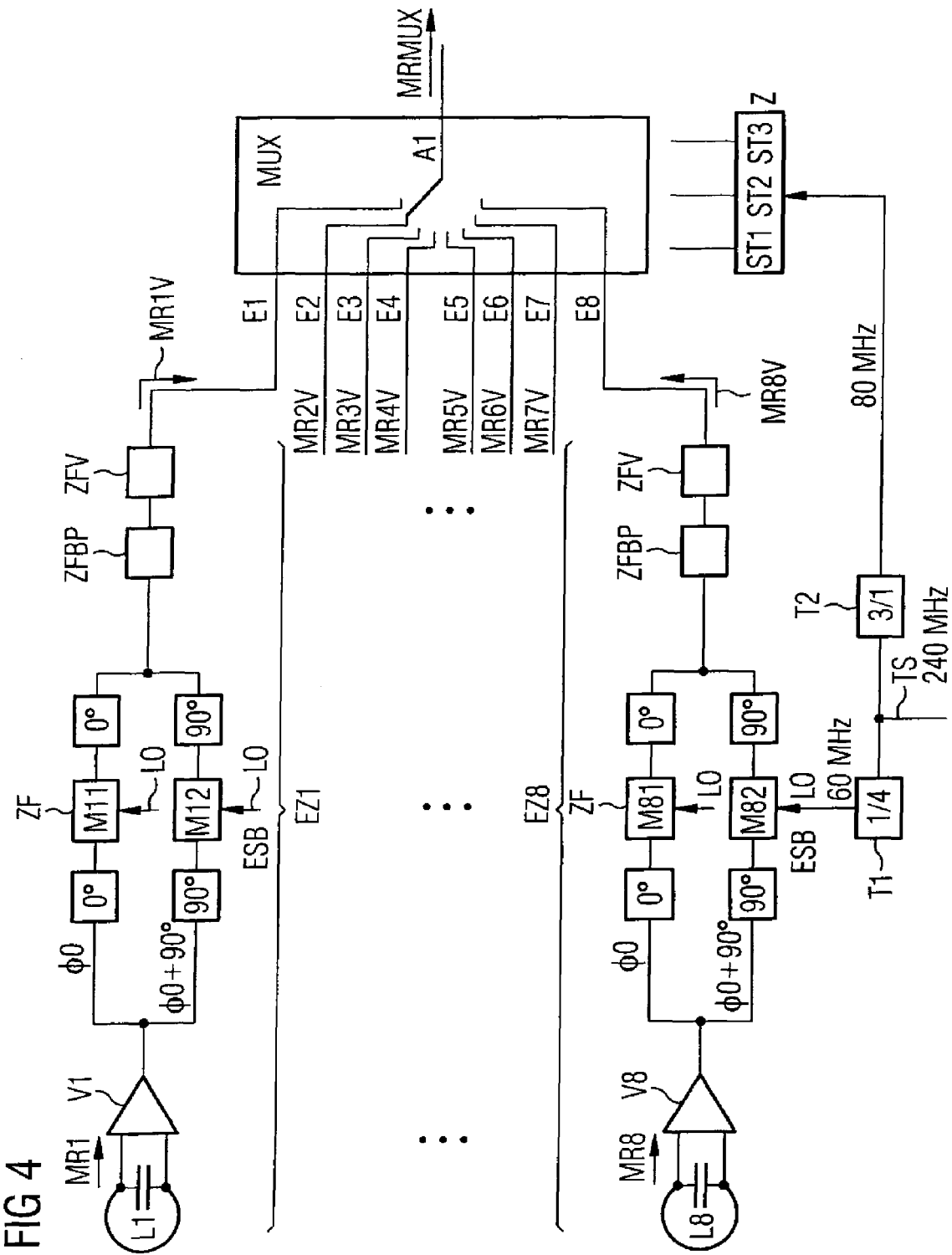

ARRANGEMENT TO TRANSMIT MAGNETIC RESONANCE SIGNALS VIA MULTIPLEXED MULTIPLEXER RECEPTION BRANCHES

BACKGROUND OF THE INVENTION

1. Field of the Invention

The invention concerns an arrangement to transmit magnetic resonance signals.

2. Description of the Prior Art

In magnetic resonance apparatuses, magnetic resonance signals are acquired with the aid of local coils. A local coil generally consists of multiple individual antennas (that are also designated as "loops").

During the magnetic resonance examination, excited atomic nuclei induce respective voltages in the individual antennas of the local coil as magnetic resonance signals that are amplified with low noise and transferred to a receiver. This transfer generally ensues via wires.

FIG. 11 shows in a severely simplified representation a magnetic resonance apparatus according to the prior art.

A patient P is located in a central region ZB that is surrounded by a magnet M. Here eight local coils LS are arranged on the patient himself, wherein each local coil LS has a preamplifier VS associated with it as well as a local coil cable LSK associated with it.

A preamplified acquisition signal of the associated local coil LS is thus available at each local coil cable LSK for processing.

The shown eight local coil cables LSK possess respective sheath wave barriers MWS with which a decoupling is implemented relative to a transmission magnetic field used for magnetic resonance examination.

The local coil cables LSK are combined into a cable strand KS. With the aid of the cable strand KS, the preamplified acquisition signals are directed out from the central region ZB of the magnet M and supplied to a receiver R for additional processing.

In modern magnetic resonance apparatuses, the cable strand KS (which is often multiple meters in length) is directed in a mobile patient bed PL. The following problems result due to this direction or the bed movement:

Each local coil LS is connected with the associated local coil cable LSK via a plug ST. Plug bunches are thereby formed at predetermined locations, which plug bunches on the one hand have a large space requirement and on the other hand must be connected or, respectively, detached by the operator at every examination, with great time expenditure.

The sheath wave barriers MWS of the conductor loop cable LSK as well as the cable strand KS likewise require valuable space that is only available to a limited extent in the central region ZB and in the patient bed PL.

Due to the mobile patient bed PL, the cable strand KS must be fashioned to be very flexible and capable of being mechanically stressed, so higher costs are incurred.

SUMMARY OF THE INVENTION

An object of the present invention is to provide an arrangement with which a transfer of magnetic resonance signals from local coils to a receiver is enabled with low expenditure of space and costs.

The arrangement according to the invention for transfer of magnetic resonance signals has at least two reception branches. Each reception branch respectively contains an individual antenna or local coil as well as an amplifier connected with the individual antenna, such that an amplified magnetic resonance signal is formed from a magnetic resonance signal that is acquired via the individual antenna. A multiplexer is provided in which every input is connected with a respective reception branch so that the amplified magnetic resonance signals of the reception branches are combined by the multiplexer into a resulting signal with the aid of a time multiplexing method. A transfer path is connected on the one hand with an output of the multiplexer and on the other hand with a receiver, such that the resulting signal is transferred from the multiplexer to the receiver via the transfer path.

The previously necessary cabling expenditure between the individual antennas on the one side and the receiver on the other side is reduced via the arrangement according to the invention. Previously required coaxial cables as well as their sheath wave barriers are omitted via the advantageous use of an optical transfer path. Costs and space are thereby saved.

With the combination of the employed time multiplexer with the optical transfer path it is possible to transfer multiple individual antenna signals in time multiplex via only one optical conductor.

BRIEF DESCRIPTION OF THE DRAWINGS

FIG. 1 shows the arrangement according to the invention in a basic block presentation.

FIG. 3 shows a signal shape with Sample & Hold elements as well as line equalizers, with reference to FIG. 1.

FIG. 4 shows an embodiment of the invention with single sideband mixers before the multiplexer, with reference to FIG. 1.

DESCRIPTION OF THE PREFERRED EMBODIMENTS

Figure 2A:
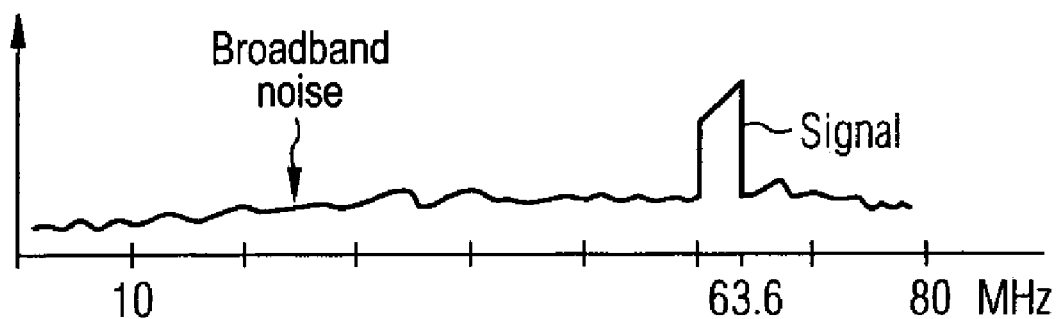
FIGS. 2a, 2b and 2c show exemplary spectra for a time multiplexing method according to FIG. 1.

FIG. 1 shows the arrangement according to the invention in a principle block presentation.

A local coil LS here exemplarily has eight individual antennas L1 through L8.

A first reception branch EZ1 possesses an individual antenna L1, a low-noise amplifier V1 and a filter BP1 fashioned as a bandpass filter and tuned to 63.6 MHz, for example.

Additional reception branches EZ2 through EZ8 are correspondingly designed. The signal flow of the first reception branch EZ1 is representatively explained in detail.

An acquired first magnetic resonance signal MR1 of the individual antenna L1 arrives at the low-noise amplifier V1 in order to form an amplified signal MR1V. The amplified signal MR1V is supplied to the filter BP1.

The now-filtered signal MR1V arrives at a first input E1 of a multiplexer MUX that possesses eight inputs E1 through E8 corresponding to the eight reception branches EZ1 through EZ8.

The reception branches EZ2 through EZ8 (not shown or, respectively, described in detail here) form correspondingly amplified and filtered signals MR2V through MR8V that are likewise connected to respectively associated inputs E2 through E8 of the multiplexer MUX.

The signals MR1V through MR8V are combined by the multiplexer MUX into a signal MRMUX using a time multiplexing method and are transferred via a transfer path or signal line SL to a receiver REC.

For example, the transfer path could be designed as a wired or optical transfer path or as a radio transmission path.

For example, a coaxial cable or an optical waveguide or a combination with a transmitter diode and with a receiver diode is used as a signal line SL.

After transfer of the signal MRMUX has occurred, an additional amplification ensues at the receiver with the aid of a reception amplifier VE as well as an analog-digital conversion of the signal with the aid of an A/D converter ADC.

The digitized signal is divided up again into individual signals with the aid of downstream elements (not described in detail here), wherein every individual signal can respectively be uniquely associated again with one of the acquisition branches EZ1 through EZ8. This division corresponds to a time demultiplexing method that is correspondingly adapted to the transmission-side time multiplexing method.

The reception branches EZ1 through EZ8 and the multiplexer MUX are parts of a local coil housing LSG. The local coil housing LSG moreover comprises a counter Z that is connected via three control lines ST1 through ST3 with the multiplexer MUX. Three bits to switch the multiplexer MUX are transferred in parallel via these, wherein a "most significant bit (MSB)" is transferred with the aid of the control line ST3 and a "least significant bit (LSB)" is transferred via the control line ST1. Eight "switch settings" of the multiplexer MUX can thus be addressed with the aid of the transferred three bits.

At the receiver side, a clock generator TG is arranged that supplies both the receiver-side A/D converter ADC and the counter Z with a clock signal TS. For example, here the clock signal TS is transferred as an 80 MHz clock via a separate clock line TL, wherein both the signal line SL and the clock line TL are components of a local coil cable.

The received magnetic resonance signals MR1 through MR8 are narrowband signals with a relatively small bandwidth that is typically 1%, provided by the ratio of a gradient swing of +/−10 millitesla to a basic magnetic field strength of, for example, 1.5 Tesla.

A necessary bandwidth requirement of approximately 800 kHz therefore results per reception channel. A sub-sampling of the acquired magnetic resonance signal is accordingly possible in a time multiplexing method. Theoretically, a Nyquist sample rate of 1.6 Msamples/s (real data) per channel would be sufficient.

However, this sub-sampling has the effect of an ambiguity with regard to the input frequency, such that the receiver could also receive additional noise of the patient, antenna and preamplifier at other frequencies.

Therefore, the bandpass filters with a certain edge steepness are required before the sampling in order to achieve a masking of the broadband noise.

In order to reduce the expenditure for the filters, the sample rate per channel will be distinctly greater than the aforementioned theoretical minimum.

Surface wave filters (SAW filters) that possess advantageous properties are preferably used as bandpass filters because they can be of compact design, can be produced form non-magnetic material, exhibit a good edge steepness, has a significant capability to be driven at full output and a good linearity, and can be economically produced in large quantities.

FIG. 2 shows exemplary spectra for a time multiplexing method according to FIG. 1.

The system described in FIG. 1 with eight acquired magnetic resonance signals or, respectively, with eight reception branches operates with a total sample rate of 90 MHz (see the clock frequency there).

Each reception branch is therefore sampled with a multiplex cycle frequency of 10 MHz. The desired magnetic resonance band has an exemplary width of 800 kHz around a center frequency of 63.6 MHz—for example, 63.2 to 64 MHz here.

The parallel reception frequencies then lie in the range from n×10 MHz±3.6 MHz—here at 3.6 MHz, 6.4 MHz, 13.6 MHz, 16.4 MHz, . . . , etc.

Limits of the nearest rejection bands is particularly decisive for the design of the bandpass filter. Here these are 120 MHz−63.2 MHz=56.8 MHz and 130 MHz−640 MHz=66.0 MHz.

FIG. 2a shows a spectrum after one of the preamplifiers V1 through V8.

Figure 2B:
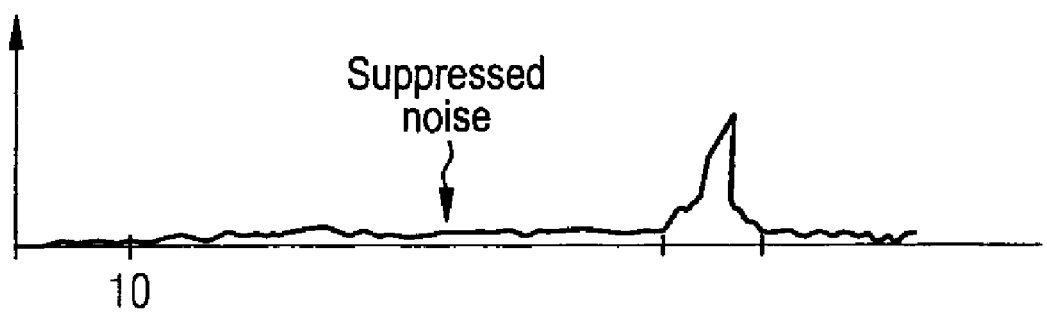

FIG. 2b shows a spectrum after one of the prefilters or bandpass filters BP1 through BP8.

Figure 2C:
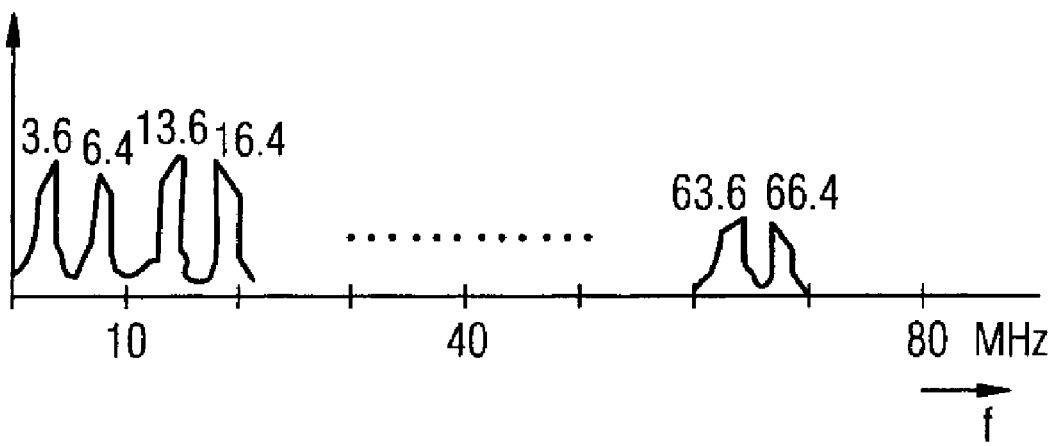

FIG. 2c shows a spectrum after the multiplexer MUX.

FIG. 3 shows an embodiment of the invention with regard to FIG. 1, with a signal shaping that is implemented with the use of sample & hold elements S&H1, S&H2 as well as an equalizer EQU.

In the simplest variant of the time multiplexer MUX, sections of respective RF oscillations are transferred on the signal line SL during respective sample time slices.

Spectra transferred on the signal line SL are arranged according to emphasis around an original radio frequency. To reduce transmission losses, it is possible to register the respective signal only briefly at the multiplexer MUX (for example less than half a radio-frequency period in length) and to hold it for the remainder of the time slice. This occurs with the use of a first sample & hold element S&H1.

For example, the multiplexer MUX switches only briefly to one of the inputs E1 through E8 in order to then be left "open". The focal point of the spectrum is therefore displaced towards lower frequencies at the output of the multiplexer MUX.

The input signal at the receiver-side A/D converter ADC should be as constant as possible during a sample interval. This is most simply achieved via an additional sample & hold element S&H2.

FIG. 4 shows an advantageous development of the invention with reference to FIG. 1, with single sideband mixers ESB before the multiplexer MUX.

Each of the reception branches EZ1 through EZ8 possesses a single sideband mixer ESB with which the respective magnetic resonance signals MR1 through MR8 are converted into an intermediate frequency plane ZF.

Here the first reception branch EZ1 is explained in detail as representative for all reception branches EZ1 through EZ8.

The magnetic resonance signal MR1 is acquired by the individual antenna L1 and amplified by the amplifier V1. It is subsequently supplied both to the branch known as a "φ0" phase branch (realized here with a 0° phase shifter) and the branch known as a "φ0+90°" phase branch (realized here with a 90° shifter) of the single sideband mixer ESB.

An output signal of the 0° phase shifter is converted by a mixer M11 and a local oscillator LO into the intermediate frequency ZF and arrives via an additional 0° phase shifter at a bandpass ZFBP that is tuned to the intermediate frequency ZF.

An output signal of the 90° phase shifter is converted into the intermediate frequency ZF with the aid of a mixer M12 and the local oscillator LO and arrives—together with the output signal of the additional 0° phase shifter—at the bandpass ZFBP as a sum signal via an additional 90° phase shifter.

The output signal of the bandpass ZFBP arrives via an intermediate frequency amplifier ZFV at the multiplexer MUX as an amplified magnetic resonance signal MR1V of the first reception branch EZ1.

The conversion into the intermediate frequency ZF advantageously occurs at a relatively low intermediate frequency ZF of 2.6 MHz, for example.

The frequency of the local oscillator LO used for this is then appropriately a multiple of the sample frequency, for example 6×10 MHz here.

It is thereby achieved that the necessity of narrow bandpass filters for the acquisition frequency can be bypassed. Here it is to be further noted that these variants with frequency conversion are not part of a "frequency division multiplex (FDM)" method because all reception branches EZ1 through EZ8 use the same intermediate frequency.

The transmission channel or the signal line SL must theoretically provide at least a bandwidth up to half of the total sample frequency—thus here 0 MHz to 40 MHz. In order to achieve a low crosstalk without great effort, here approximately a doubled bandwidth (thus 80 MHz) is required in practice.

Within this bandwidth, linear distortions of the transmission path can be adjusted to be small enough in order to enable a crosstalk damping of greater than 20 database.

If a long, thin coaxial cable is used as a signal line SL, it may be necessary to compensate dispersion with a suitable line equalizer.

However, it is also possible to compensate for crosstalk after the digitization at the receiver by means of a weighted addition of the scan values from the adjacent time slices.

The clock signal TS here has a frequency of 240 MHz that is converted with the aid of two splitters T1, T2 into the local oscillator frequency LO at 60 MHz and the clock frequency for the counter Z at 80 MHz.

Figure 5:
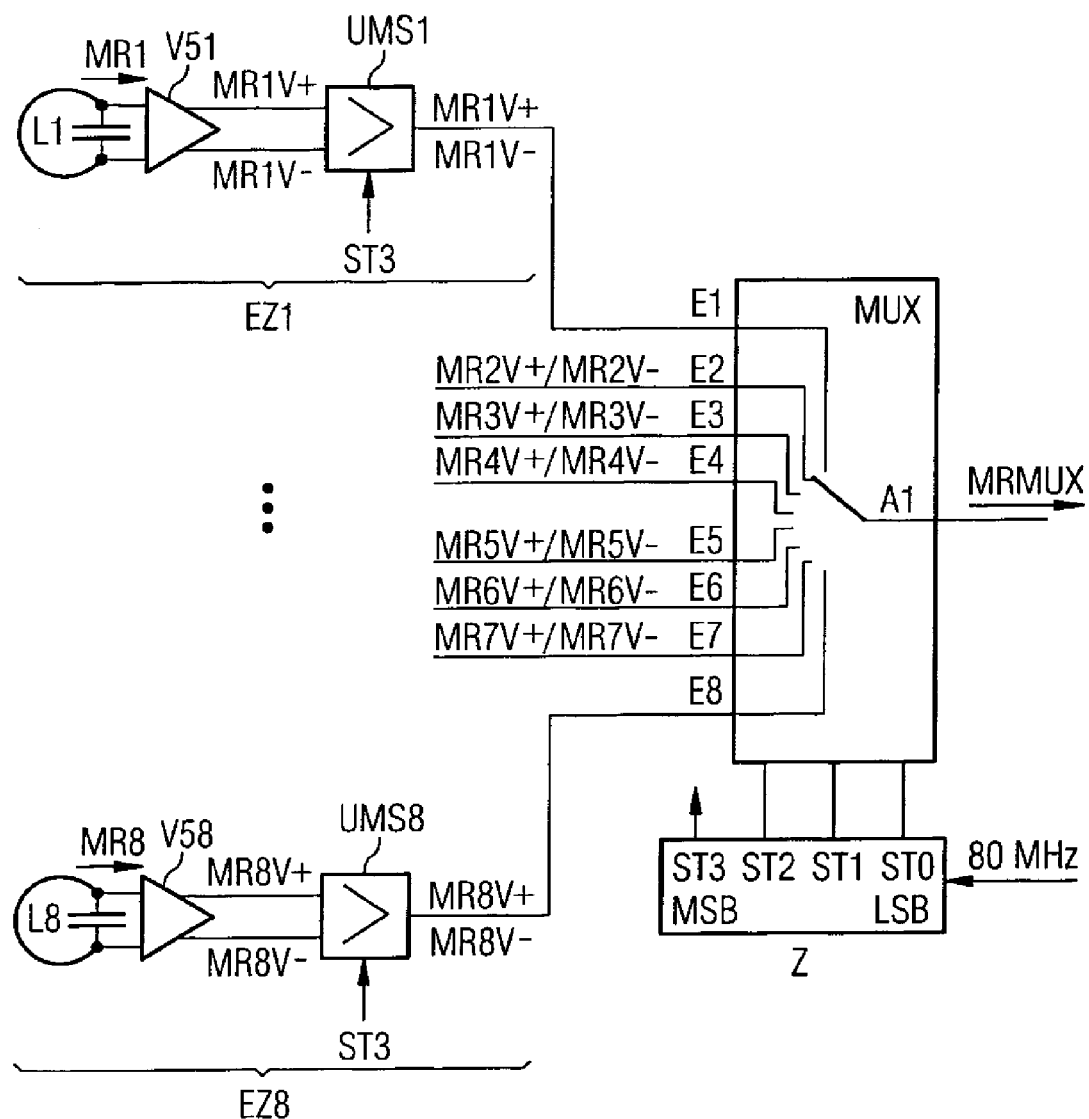
FIG. 5 shows an additional embodiment of the invention with change-over switches or alternators, with reference to FIG. 1.

FIG. 5 shows an additional advantageous development of the invention with reference to FIG. 1, with change-over switches or alternators UMS1 through UMS8 before the multiplexer MUX.

The respective reception branches EZ1 through EZ8 here have alternators UMS1 through UMS8 to which the respective magnetic resonance signal MR1 through MR8 is supplied after amplification, and possibly after an additional intermediate frequency conversion.

The first reception branch EZ1 is explained in detail as representative of all reception branches EZ1 through EZ8.

The magnetic resonance signal MR1 is acquired via the individual antenna L1 and amplified by the amplifier V51. Both an amplified positive magnetic resonance signal MR1V+ and an amplified negative magnetic resonance signal MR1V− are formed by the amplifier V51, both of which are supplied to the alternator UMS1. The alternator UMS1 is designed comparable to a change-over switch that is switched with the use of a signal ST3.

In an embodiment (not shown here), both the magnetic resonance signal MR1V+ and the magnetic resonance signal MR1V− are converted into the intermediate frequency before both arrive at the alternator UMS1.

Stated more simply, the amplified magnetic resonance signal of the first reception branch EZ1 is relayed via the alternator UMS1 to the multiplexer MUX with alternating polarity.

In this embodiment, the polarity of the relayed magnetic resonance signal MR1V changes after every sample cycle.

For example, here all acquired magnetic resonance signals MR1V through MR8V of the eight reception branches EZ1 through EZ8 are first transferred with positive polarity sign—thus as signals MR1V+ through MR8V+.

All received magnetic resonance signals MRxV of the eight reception branches EZ1 through EZ8 are subsequently transferred with negative polarity sign—thus as signals MR1V− through MR8V−.

The most significant bit (MSB) of the counter 4 is advantageously used as a signal ST3, which counter Z is realized here as a 4-bit counter and is clocked with a frequency of 80 MHz.

Figure 6:
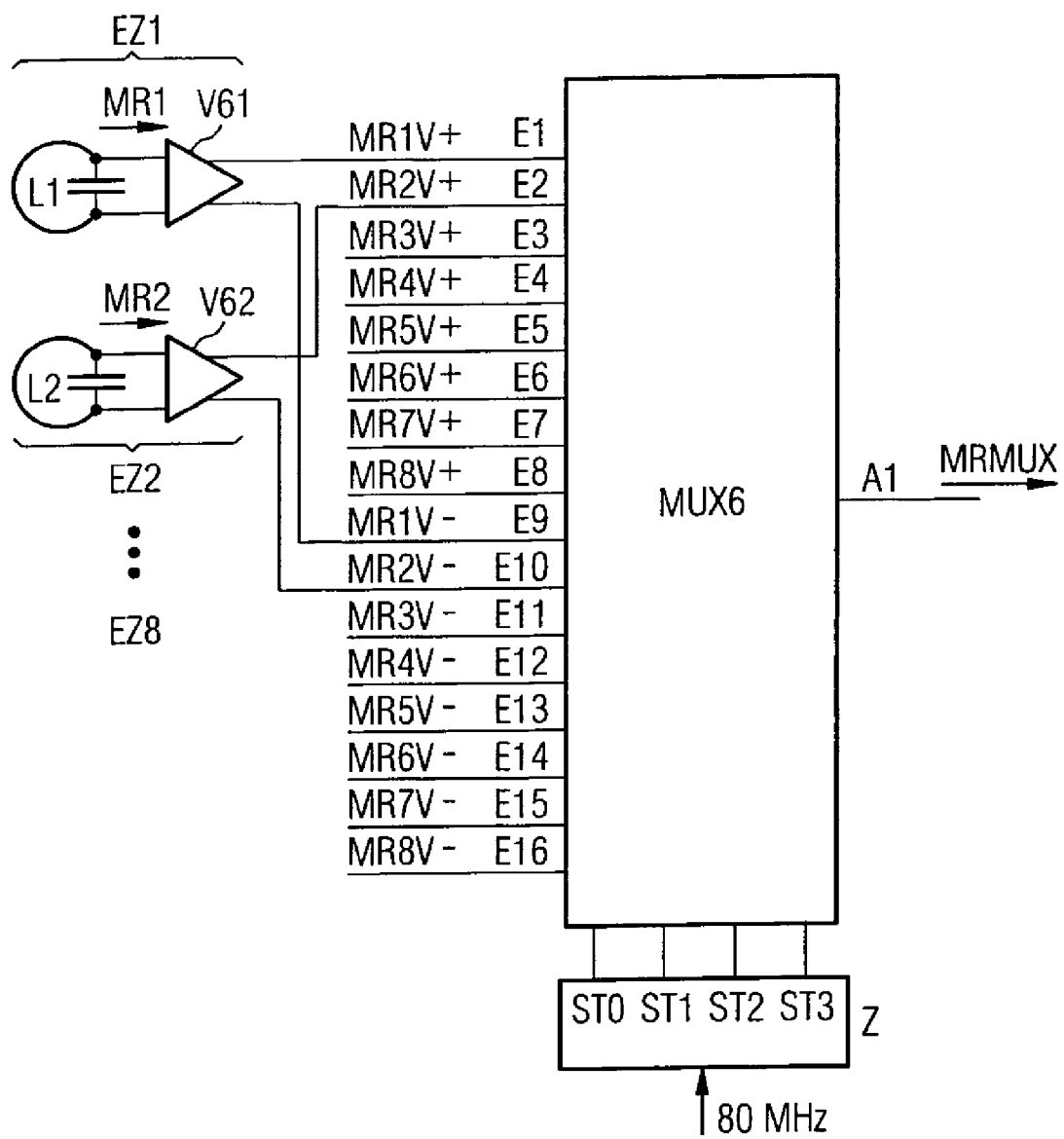
FIG. 6 shows an alternative to FIG. 5.

FIG. 6 shows an advantageous alternative to FIG. 5 without alternators.

A multiplexer MUX6 with 16 inputs E1 through E16 is used.

Each of the reception branches EZ1 through EZ8 in turn provides two amplified magnetic resonance signals MRxV+ or, respectively, MRxV−.

In one development (not shown here, the two magnetic resonance signals MRxV+, MRxV− are converted into the intermediate frequency before they arrive at the multiplexer MUX6.

The amplified magnetic resonance signals with positive polarity sign—thus MR1V+ through MR8V+− are supplied to the inputs E1 through E8 of the multiplexer MUX6 while the amplified magnetic resonance signals with negative polarity sign—thus MR1V− through MR8V−—are supplied to the inputs E9 through E16 of the multiplexer MUX6.

A 4-bit counter Z that is clocked at 80 MHz is again used to control the multiplexer MUX6.

The following advantages result from the variants described in FIG. 5 and FIG. 6:

Feedback from the signal line LS to the individual antennas L1 through L8 is avoided. This feedback is generally difficult to control since the signal line runs in the near field of the highly sensitive magnetic individual antennas L1 through L8. An RF-tight shielding of the signal line SL is only possible to a very limited extent due to the compatibility with the RF transmission and gradient fields.

No frequency shift occurs in the time multiplexing in the previously described basic form, such that the spectrum on the signal line SL contains frequency components at the original acquisition frequency.

The use of magnetic resonance signals with alternating polarity sign described in FIG. 5 and FIG. 6 corresponds to the use of a mix with 5 MHz or, respectively, a shift of all spectral components by 5 MHz. The spectrum is therefore freed of portions at 63.6 MHz, and the nearest bands are at 61.4 MHz and 66.4 MHz.

Moreover, quadratic distortions are corrected because surface waves that are formed by unwanted, non-linear distortions of the second order no longer occur in the evaluated frequency band due to the use of alternating magnetic resonance signals for multiplexing.

For a magnetic resonance frequency of 63.3 MHz that corresponds to a least multiplex spectral component of 3.3

MHz, a harmonic at 6.6 MHz would arise that would be seen at 3.4 MHz due to the 10 MHz sampling and that would disrupt the reception band.

In the method illustrated in FIG. 5 and FIG. 6, the lowest signal band appears at 5 MHz–3.3 MHz=1.7 MHz. The surface wave again generated at 3.4 MHz would now lie well outside the frequency range used.

The connection illustrated here likewise applies for the higher spectral bands of the multiplex signal, for example 190 MHz–2×63.3 MHz=63.4 MHz relative to 2×61.7 MHz–60 MHz=63.4 MHz.

Particular difficulties can occur for the acquisition of magnetic resonance signals of other atomic types than hydrogen (what are known as "X-nuclei") if their Larmor frequency in the selected basic magnetic field lies very close to integer multiples of half of the cycle frequency (n×5 MHz).

The ambiguous frequency ranges overlap at these "Nyquist limits", and unwanted fold-overs can no longer be corrected by bandpass filters. Subsequent Figures FIG. 7 and FIG. 8 show solutions for this problem.

Figure 7:
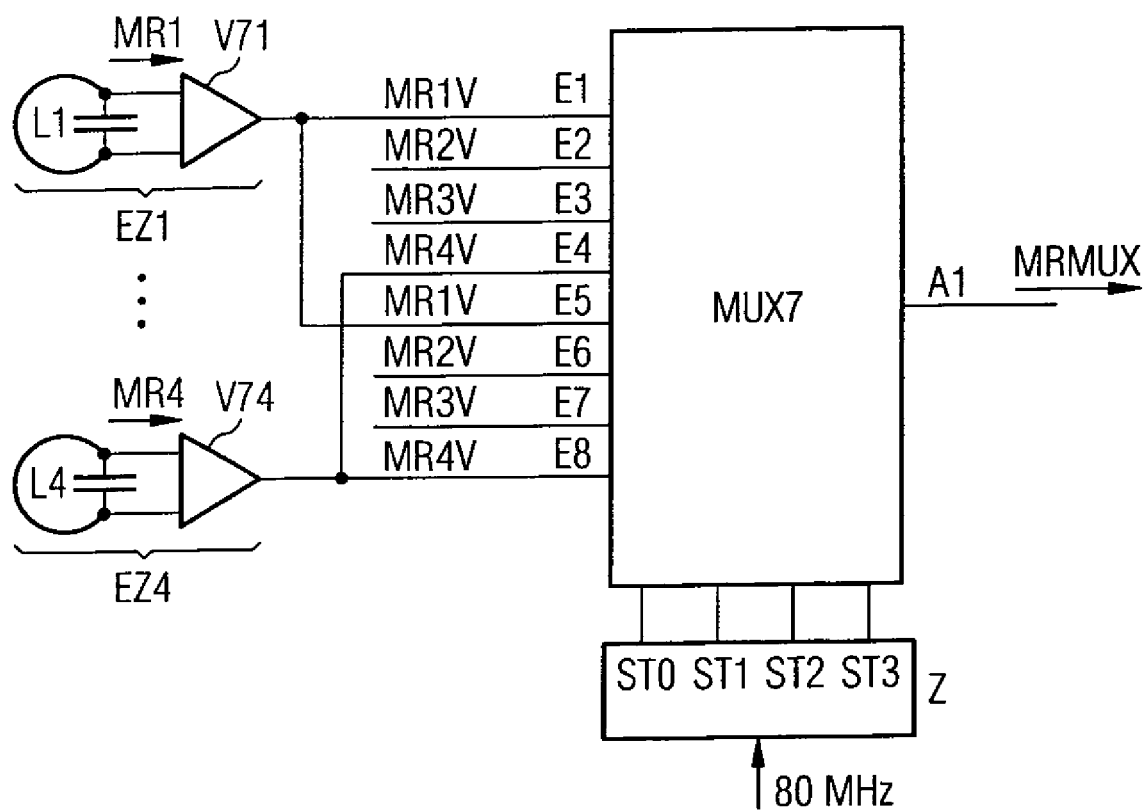
FIG. 7 and FIG. 8 show an arrangement according to the invention as an alternative to FIG. 1, for what is known as an "X-nuclei" acquisition.
Figure 8:
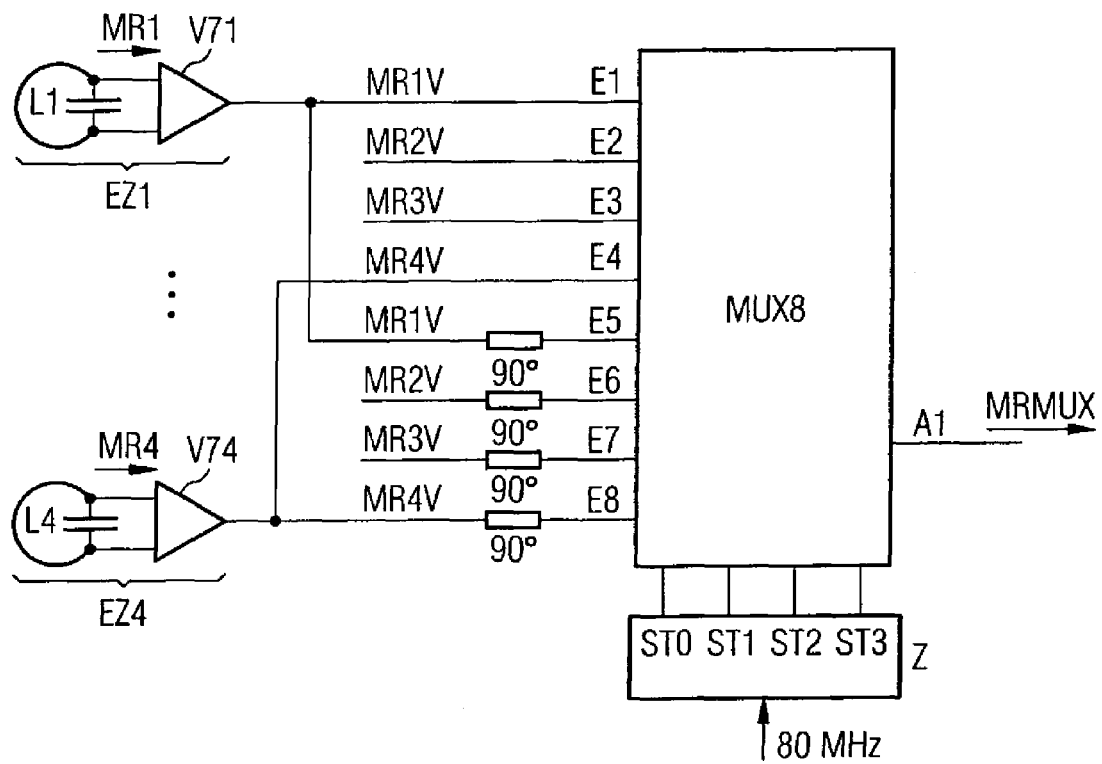

FIG. 7 shows an arrangement according to the invention for an "X-nucleus acquisition", as an alternative to FIG. 1.

A local coil LS here has four individual antennas L1 through L4, for example.

A first reception branch EZ1 possesses one individual antenna L1 and a low-noise amplifier V71.

Additional acquisition branches EZ2 through EZ4 are designed correspondingly. The signal flow of the first reception branch EZ1 is representatively explained in detail.

A multiplexer MUX7 is provided for implementation of a time multiplexing method, wherein the multiplexer MUX7 has in total eight inputs E1 through E8 as well as an output A1.

An acquired first magnetic resonance signal MR1 of the individual antenna L1 arrives at the low-noise amplifier V1 in order to form an amplified signal MR1V.

The amplified signal MR1V arrives both at a first input E1 of the multiplexer and at an additional input E5 of the multiplexer MUX7.

The reception branches EZ2 through EZ4 (not shown or, respectively, described in detail here) form correspondingly amplified signals MR2V through MR4V.

The signal MR2V arrives both at the input E2 and at the input E6 while the signal MR3V arrives both at the input E3 and at the input E7, and the signal MR4V arrives both at the input E4 and at the input E8.

In an embodiment (not shown here), conversion of the signals into the intermediate frequency range is conducted after the respective amplifiers and before the multiplexer MUX7.

The signals MR1V through MR4V are combined into the signal MRMUX by the multiplexer MUX7 using a time multiplexing method in order to subsequently be transferred to a receiver REC via a transmission path or, respectively, signal line SL.

The transmission path could, for example, be designed as a wired or optical transmission path or as a radio transmission path.

For example, a coaxial cable or an optical waveguide or a combination with a transmitting diode and a receiving diode is used as a signal line SL.

Normally the frequency plan and the receiver number of a magnetic resonance system will be optimized for hydrogen resonance since the largest signals occur here and they are used for the largely predominant number of examinations.

However, other nuclei (what are known as the "X-nuclei") in other frequency bands can also be acquired solely by exchanging the pluggable local coil modules with the associated filters.

The pre-filtering is best realizable when the magnetic resonance frequencies doe not lie too close to multiples of half the cycle frequency (here 5 MHz). Otherwise, alias bands to be blocked approach very close to the usable frequencies.

In the event of odd-numbered multiples (for example 25 MHz), the cycle frequency (sample frequency per channel) can be doubled in an unmodified system in that two time slices are provided to each receiver element (as shown here). The accompanying halving of the channel number is a tolerable disadvantage since it relates only to examinations with the special X-nucleus.

In the event that the resonance frequency of an X-nucleus contrarily lies close to a multiple of the cycle frequency itself (for example 60 MHz), a doubling of the sample rate alone is not sufficient.

However, here it is possible (as shown in FIG. 8) to supply the respective magnetic resonance signals MR1 through MR4 of the reception branches EZ1 through EZ4 to the multiplexer MUX8 with different phase shifts (for example realized here with 0° or, respectively, 90° phase shift).

In an embodiment (not shown here), conversion of the signals into the intermediate frequency range is conducted after the respective amplifiers and before the multiplexer MUX8.

In connection with a change of the polarity sign at every second cycle, a sequence of sample values that are weighted with (1, j, −1, −j) is obtained. This corresponds to a spectral shift by one half of the cycle frequency (here 5 MHz).

The signal with 20 Msamples/s can subsequently be shown without fold-overs. The polarity sign change can be implemented either with the described analog alternator or even via subsequent digital multiplication with a series of (1, 1, −1, −1).

Figure 9:
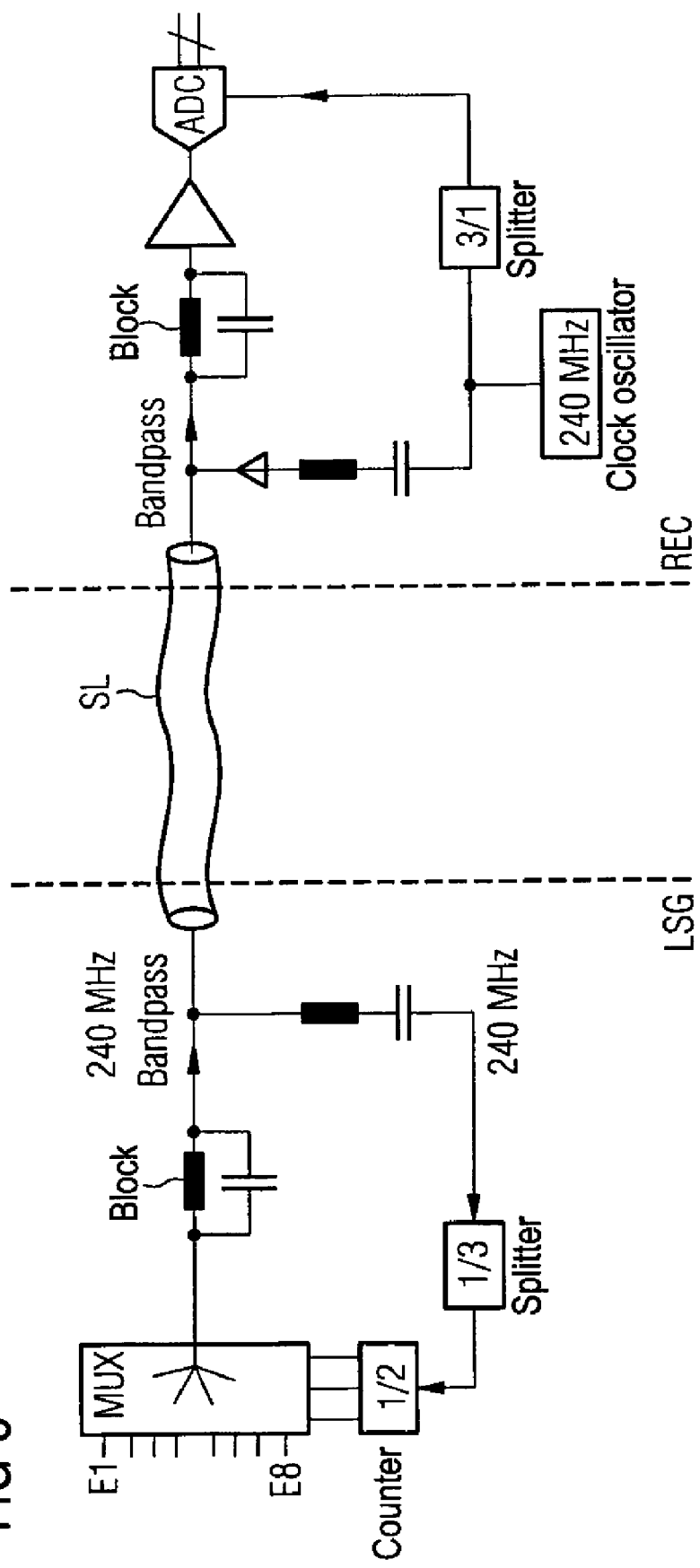
FIG. 9 shows an embodiment of the invention as an alternative to FIG. 1, in which a clock signal is additionally transferred as well via the signal line SL.

FIG. 9 shows an embodiment as an alternative to FIG. 1, in which a clock signal is additionally transmitted as well over the signal line SL.

The clock frequency for the multiplexer (here 10 MHz or, respectively, 5 MHz, for example) is selected so that none of its multiples coincides with a used magnetic resonance acquisition frequency.

Larmor frequencies of other nuclei than hydrogen are thereby also considered. The A/D converter ADC at the receiver is also operated with a multiple of the clock frequency.

The digitized spectra are then generally free of inherent interference due to the reception system.

A centrally generated clock signal must be supplied to the multiplexer MUX to establish a constant time and phase reference.

If its frequency is selected outside of the occupied multiplexer spectrum, the coaxial lines used for signal transfer can be used as well for transmission.

The clock signal is fed in and out via filters.

If common multiples (for example 240 MHz) of the clock signal (see 80 MHz in FIG. 1) are transferred to the LO frequency (see 60 MHz), all internal frequencies can be generated by simple divider circuits.

A channel can be marked (for example via a somewhat deviating DC offset) for correct association of the time slices and for fine synchronization of the sampling points in time if the conductor length is not precisely known in advance.

This can be permanently present, systematically alternated (for example 5 MHz), or only applied during a dedicated calibration interval after establishing the line connection.

Figure 10:
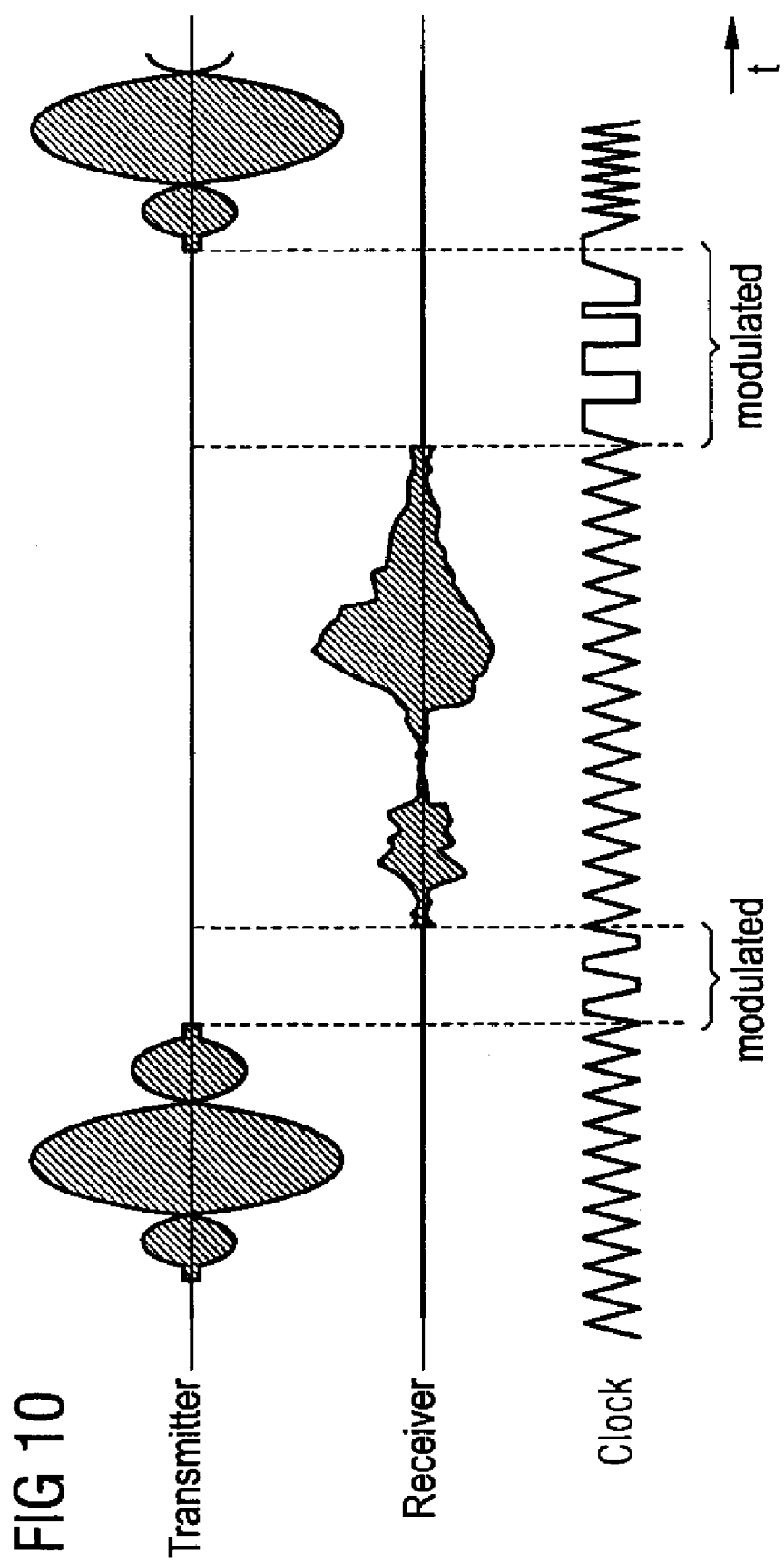
FIG. 10 illustrates a data transfer in transmission-reception switching pauses, related to FIG. 1.
Figure 11:
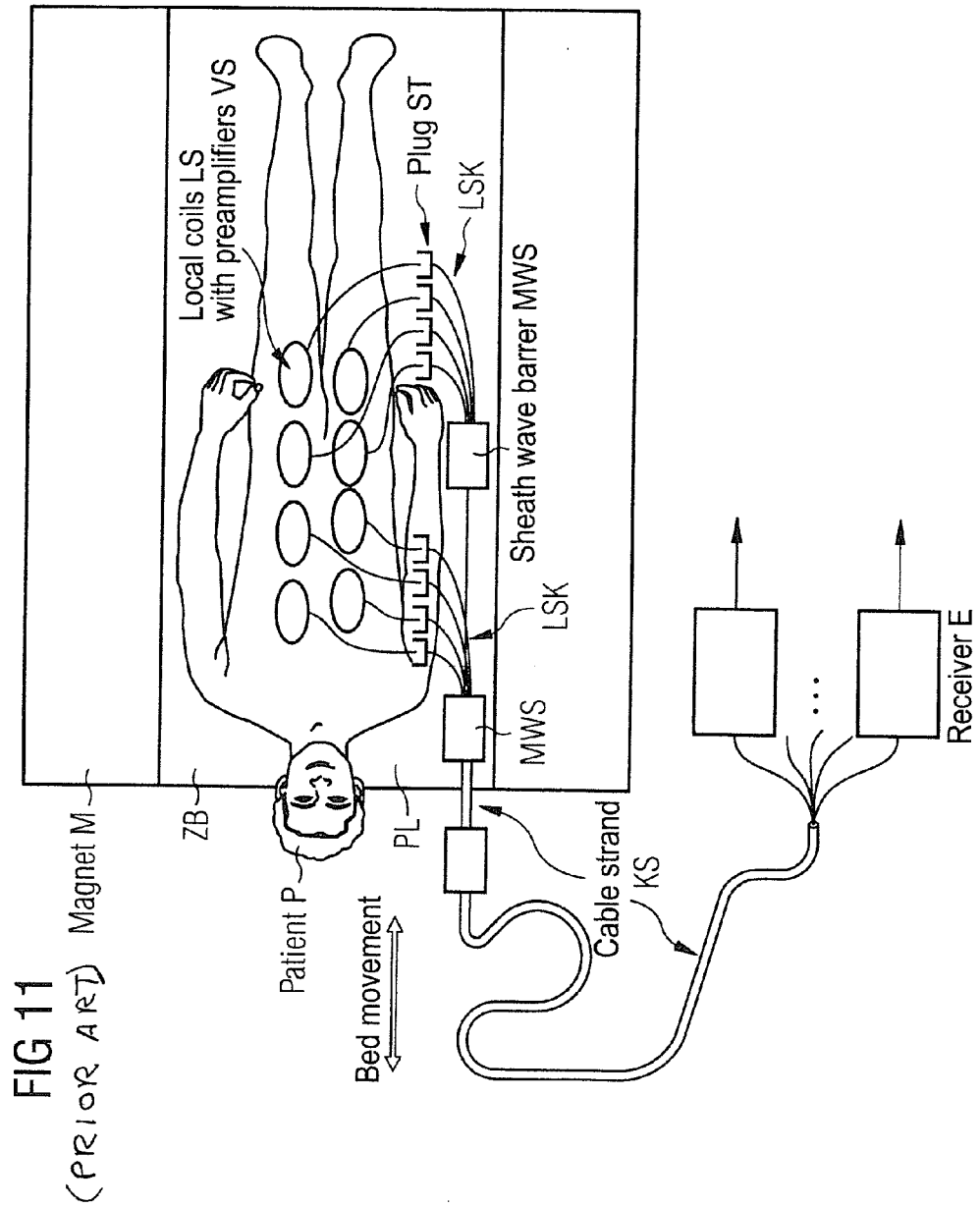
FIG. 11 shows a magnetic resonance apparatus according to the prior art as described above.

FIG. 10 shows a data transfer from a control unit of the magnetic resonance system to the local coils in the transmission-reception switching pauses, relative to FIG. 1.

The centrally generated control clock (comparable to FIG. 9) can also be used as well for serial transmission of digital control signals to the local coils.

For example, it is reasonable to activate the PIN diode detuning circuits or to switch the preamplification.

Either a separate data line directed in parallel (two-wire protocol) or a modulation of the clock signal itself can be used for information transmission.

Disruption of the acquisition due to the control signals must thereby be avoided. In an MR system, the acquisition operation is normally always interrupted again by transmission phases for MR excitation. These times (or even only the transmission-reception switching pauses, which are only a few microseconds in length) can be used for transmission of the serial frames [telegrams].

For example, up to 2400 bits can be transmitted in 10 µs at 240 MHz and a modulation with one bit per carrier period.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for transmitting magnetic resonance signals respectively generated by individual antennas of a magnetic resonance local coil, said arrangement comprising:
    a plurality of reception branches, each reception branch comprising one individual antenna of the local coil and an amplifier connected thereto that produces an amplified magnetic resonance signal as an output signal of that reception branch on a magnetic resonance signal acquired by the individual antenna;
    a multiplexer having a plurality of multiplexer inputs respectively connected to said plurality of reception branches to receive the respective amplified magnetic resonance signals therefrom, said multiplexer emitting a resulting signal at a multiplexer output by time-multiplexing the respective amplified magnetic resonance signals from the reception branches;
    a transmission path having a first end connected to said multiplexer output;
    a receiver connected to a second end of said transmission path that receives said resulting signal from said multiplexer output via said transmission path and
    said local coil having a local coil housing, and said plurality of reception branches and said multiplexer being contained in said local coil housing.

2. An arrangement as claimed in claim 1 wherein said transmission path is selected from the group consisting of optical transmission paths, hard-wired transmission paths, and radio transmission paths.

3. An arrangement as claimed in claim 1 wherein each transmission branch additionally comprises a filter that filters the amplified magnetic resonance signal in that transmission branch before the respective multiplexer input to which that transmission branch is connected.

4. An arrangement for transmitting magnetic resonance signals respectively generated by individual antennas of a magnetic resonance local coil, said arrangement comprising:
    a plurality of reception branches, each reception branch comprising one individual antenna of the local coil and an amplifier connected thereto that produces an amplified magnetic resonance signal as an output signal of that reception branch on a magnetic resonance signal acquired by the individual antenna;
    a multiplexer having a plurality of multiplexer inputs respectively connected to said plurality of reception branches to receive the respective amplified magnetic resonance signals therefrom, said multiplexer emitting a resulting signal at a multiplexer output by time-multiplexing the respective amplified magnetic resonance signals from the reception branches;
    a transmission path having a first end connected to said multiplexer output;
    a counter that is clocked by a clock signal, said counter being connected to said multiplexer and controlling the time multiplexing in said multiplexer;
    said receiver comprising a clock signal generator that generates said clock signal and supplies said clock signal to said counter; and
    a first coupling device connected between said multiplexer output and said first end of said transmission path and a second coupling device connected between said second end of said transmission path and said receiver, said first and second coupling devices operating in combination to couple said resulting signal from said multiplexer output into said transmission path and to couple said clock signal from said clock signal generator in said receiver into said transmission path.

5. An arrangement for transmitting magnetic resonance signals respectively generated by individual antennas of a magnetic resonance local coil, said arrangement comprising:
    a plurality of reception branches, each reception branch comprising one individual antenna of the local coil and an amplifier connected thereto that produces an amplified magnetic resonance signal as an output signal of that reception branch on a magnetic resonance signal acquired by the individual antenna;
    a multiplexer having a plurality of multiplexer inputs respectively connected to said plurality of reception branches to receive the respective amplified magnetic resonance signals therefrom, said multiplexer emitting a resulting signal at a multiplexer output by time-multiplexing the respective amplified magnetic resonance signals from the reception branches;
    a transmission path having a first end connected to said multiplexer output;
    a receiver connected to a second end of said transmission path that receives said resulting signal from said multiplexer output via said transmission path; and
    a sample and hold circuit connected at a location selected from the group consisting of between said multiplexer output and said first end of said transmission path and between said second end of said transmission end and said receiver, and wherein said receiver comprises an analog-to-digital converter, with said resulting signal passing through said sample and hold circuit before reaching said analog-to-digital convert.

6. An arrangement as claimed in claim 5 wherein said multiplexer is configured to implement said time multiplexing to cause respective multiplexer inputs to be connected to said multiplexer output only for a duration that is a portion of a sample interval of said sample and hold circuit.

7. An arrangement for transmitting magnetic resonance signals respectively generated by individual antennas of a magnetic resonance local coil, said arrangement comprising:
    a plurality of reception branches, each reception branch comprising one individual antenna of the local coil and an amplifier connected thereto that produces an amplified magnetic resonance signal as an output signal of that reception branch on a magnetic resonance signal acquired by the individual antenna;

a multiplexer having a plurality of multiplexer inputs respectively connected to said plurality of reception branches to receive the respective amplified magnetic resonance signals therefrom, said multiplexer emitting a resulting signal at a multiplexer output by time-multiplexing the respective amplified magnetic resonance signals from the reception branches;

a transmission path having a first end connected to said multiplexer output; a receiver connected to a second end of said transmission path that receives said resulting signal from said multiplexer output via said transmission path;

said receiver comprising:

an analog-to-digital converter; and an equalizer connected downstream of said second end of said transmission path, preceding said analog-to-digital converter.

8. An arrangement for transmitting magnetic resonance signals respectively generated by individual antennas of a magnetic resonance local coil, said arrangement comprising:

a plurality of reception branches, each reception branch comprising one individual antenna of the local coil and an amplifier connected thereto that produces an amplified magnetic resonance signal as an output signal of that reception branch on a magnetic resonance signal acquired by the individual antenna;

a multiplexer having a plurality of multiplexer inputs respectively connected to said plurality of reception branches to receive the respective amplified magnetic resonance signals therefrom, said multiplexer emitting a resulting signal at a multiplexer output by time-multiplexing the respective amplified magnetic resonance signals from the reception branches;

a transmission path having a first end connected to said multiplexer output;

a receiver connected to a second end of said transmission path that receives said resulting signal from said multiplexer output via said transmission path; and each reception branch additionally comprising a converter that converts the amplified magnetic resonance signal in that reception branch into an intermediate frequency and that supplies the amplified magnetic resonance signal at said intermediate frequency to the multiplexer input connected to that reception branch.

9. An arrangement as claimed in claim 8 wherein said converter is a single sideband mixer.

10. An arrangement for transmitting magnetic resonance signals respectively generated by individual antennas of a magnetic resonance local coil, said arrangement comprising:

a plurality of reception branches, each reception branch comprising one individual antenna of the local coil and an amplifier connected thereto that produces an amplified magnetic resonance signal as an output signal of that reception branch on a magnetic resonance signal acquired by the individual antenna;

a multiplexer having a plurality of multiplexer inputs respectively connected to said plurality of reception branches to receive the respective amplified magnetic resonance signals therefrom, said multiplexer emitting a resulting signal at a multiplexer output by time-multiplexing the respective amplified magnetic resonance signals from the reception branches;

a transmission path having a first end connected to said multiplexer output;

a receiver connected to a second end of said transmission path that receives said resulting signal from said multiplexer output via said transmission path; and each amplifier in each reception branch generating an amplified positive magnetic resonance signal and an amplified negative magnetic resonance signal.

11. An arrangement as claimed in claim 10 wherein each reception branch comprises a switch connected downstream of the amplifier in that reception branch, said switch supplying either the amplified positive magnetic resonance signal or the amplified negative magnetic resonance signal to the multiplexer input connected to that reception branch.

12. An arrangement as claimed in claim 10 wherein the respective multiplexer inputs connected to the reception branches are first multiplexer inputs, and wherein said multiplexer comprises, for each of said reception branches, a second multiplexer input, and wherein, for each reception branch, the amplified positive magnetic resonance signal is supplied to the first multiplexer input and the amplified negative magnetic resonance signal is simultaneously supplied to said second multiplexer input.

13. An arrangement as claimed in claim 10 wherein the respective multiplexer inputs connected to said plurality of reception branches are first multiplexer inputs, and wherein said multiplexer comprises, for each of said reception branches, a second multiplexer input, and wherein the amplifier in each reception branch is connected to both of the first and second multiplexer inputs for that reception branch and simultaneously supplies the amplified positive magnetic resonance signal and the amplified negative resonance signal respectively to said first and second multiplexer inputs for that reception branch.

14. An arrangement as claimed in claim 13 comprising, in each reception branch, a phase shifter for 0° phase shifting connected between the amplifier and the first multiplexer input, and a phase shifter for 90° phase shifting connected between the amplifier and the second multiplexer input.

15. An arrangement for transmitting magnetic resonance signals respectively generated by individual antennas of a magnetic resonance local coil, said arrangement comprising:

a plurality of reception branches, each reception branch comprising one individual antenna of the local coil and an amplifier connected thereto that produces an amplified magnetic resonance signal as an output signal of that reception branch on a magnetic resonance signal acquired by the individual antenna;

a multiplexer having a plurality of multiplexer inputs respectively connected to said plurality of reception branches to receive the respective amplified magnetic resonance signals therefrom, said multiplexer emitting a resulting signal at a multiplexer output by time-multiplexing the respective amplified magnetic resonance signals from the reception branches;

a transmission path having a first end connected to said multiplexer output;

a receiver connected to a second end of said transmission path that receives said resulting signal from said multiplexer output via said transmission path; and an analog-to-digital converter in said receiver, said analog-to-digital converter being connected downstream of said transmission path.

* * * * *